United States Patent [19]

Tomozawa et al.

[11] 4,014,718
[45] Mar. 29, 1977

[54] METHOD OF MAKING INTEGRATED CIRCUITS FREE FROM THE FORMATION OF A PARASITIC PNPN THYRISTOR

[75] Inventors: Akihiro Tomozawa, Hinode; Takanori Nishimura, Kokubunji; Takashi Yamaguchi, Kodaira, all of Japan

[73] Assignee: Hitachi, Ltd., Japan

[22] Filed: Sept. 2, 1975

[21] Appl. No.: 609,604

[30] Foreign Application Priority Data

Sept. 4, 1974   Japan ............................. 49-100905

[52] U.S. Cl. .............................. 148/187; 148/33.5; 148/189; 357/34; 357/48
[51] Int. Cl.² .......................................... H01L 21/22
[58] Field of Search ............... 357/34, 48; 148/187, 148/33.5, 175

[56] References Cited

UNITED STATES PATENTS

| | | | |
|---|---|---|---|
| 3,470,036 | 9/1969 | Svedberg | 148/33.5 |
| 3,798,079 | 3/1974 | Chu et al. | 148/33.5 |
| 3,916,431 | 10/1975 | Khajezadeh | 148/187 X |

*Primary Examiner*—G. Ozaki
*Attorney, Agent, or Firm*—Craig & Antonelli

[57] ABSTRACT

In order to prevent the formation of a parasitic PNPN thyristor in an integrated circuit having at least one NPN transistor, a layer of semiconductor material of a conductivity type opposite that of the substrate is formed on the substrate. An isolation region of the same conductivity type as the substrate is formed on this layer and a further layer of the same conductivity type as the isolation region, but of a higher impurity concentration, is formed on the back surface of the substrate. A diffusion layer of the same conductivity type as the substrate, which serves as the base region of the NPN transistor, is formed on the layer having the conductivity type opposite to that of the substrate. A further layer of the same conductivity type and a higher impurity concentration than the isolation region is formed on the back surface of the substrate and an insolation layer is formed on the back surface of the substrate and on the substrate. A further diffusion layer of a conductivity type opposite to that of the substrate, which serves as the emitter region of the transistor is formed using the insolation layer as a mask.

1 Claim, 14 Drawing Figures

METHOD OF MAKING INTEGRATED CIRCUITS FREE FROM THE FORMATION OF A PARASITIC PNPN THYRISTOR

FIELD OF THE INVENTION

This invention relates to a method of making semiconductor integrated circuits, and particularly has an object to provide a method of making integrated circuits (hereinafter referred to as ICs) free from possible formation of an inverted layer that may develop on the back face of a silicon substrate employed in the bipolar-type monolithic ICs, thereby preventing the formation of a PNPN thyristor which is caused by the inverted layer.

BACKGROUND OF THE INVENTION

As is well known, the bipolar-type monolithic ICs include silicon substrates of the P-type since NPN transistors are employed as main elements in the circuit. Therefore, where the NPN transistor is operated at a saturated state, the P-type silicon substrate, N-type epitaxial layer formed on the P-type silicon substrate and P-type base region formed on the N-type epitaxial layer start to work as a collector, base and emitter, respectively, which form a parasitic PNP transistor. Further, if a pellet consisting of P-type silicon substrate is bonded to a support such as stem, tub or lead frame by an eutectic alloy of the silicon and gold, an N-type inverted layer is formed between the P-type silicon substrate and the support. As a result, the N-type inverted layer works as an emitter, P-type silicon substrate as a base, and N-type epitaxial layer as a collector so that a parasitic NPN transistor is formed. In this way, a thyristor of the PNPN structure is adversely formed by these PNP and NPN transistors.

SUMMARY OF THE INVENTION

Accordingly, it is an object of the present invention to provide a method of making ICs, in which the formation of an N-type inverted layer is inhibited between the silicon substrate and the support such as a stem, tub, or lead frame, whereby the formation of a PNPN thyristor is prevented that results from the N-type inverted layer.

For the purpose of accomplishing the aforementioned object, the basic structure of the present invention comprises an integrated circuit having at least one or more NPN transistors using a semiconductor substrate of one conductivity type, characterized in that a layer of the second conductivity type is formed on said substrate, an isolation region of the first conductivity type is formed in said layer, a layer of the first conductivity type having a high impurity concentration is formed on the back face of said substrate, a diffusion layer of the first conductivity type which serves as a base region of said NPN transistor is formed in said layer of the second conductivity type, a layer of the first conductivity type having a high impurity concentration is formed on the back face of said substrate, an insulation layer is formed on the back face of said substrate and on the substrate, a diffusion layer of the second conductivity type which serves as an emitter region of said NPN transistor is formed with said insulation layer as a mask.

The invention will be described in detail with reference to the accompanying drawings.

DETAILED DESCRIPTION OF THE INVENTION

Figure 1A:
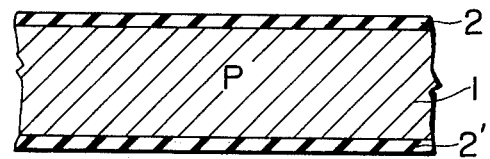
FIGS. 1a – 1n are schematic cross-sectional views showing an embodiment of the present invention.
Figure 1B:
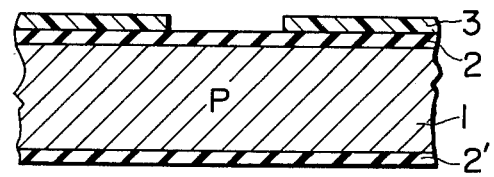
Figure 1C:
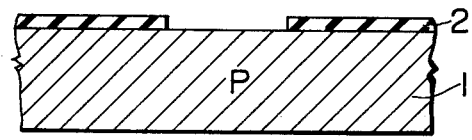
Figure 1D:
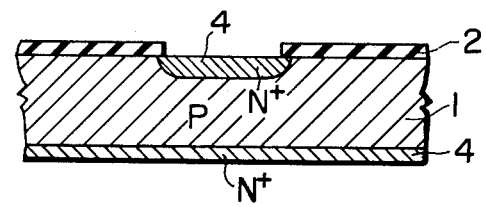
Figure 1E:
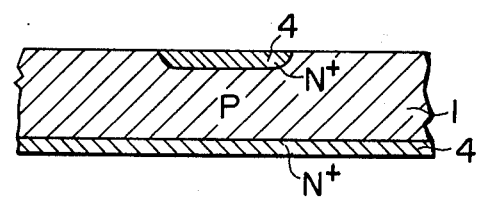
Figure 1F:
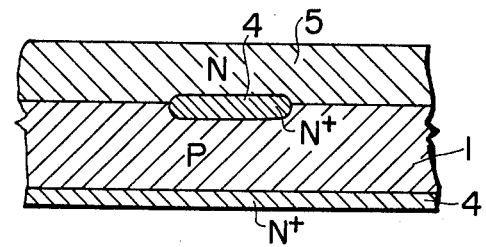
Figure 1G:
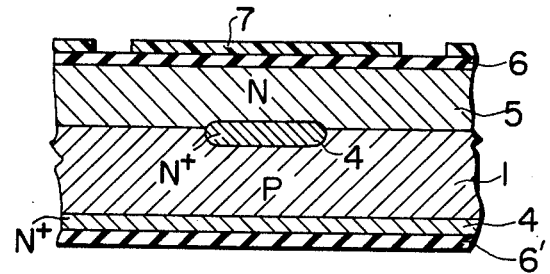
Figure 1H:
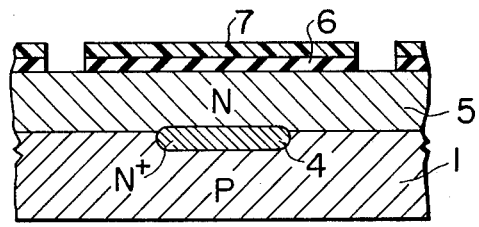
Figure 1I:
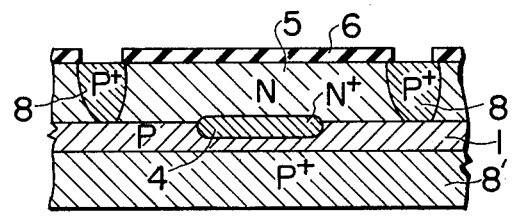
Figure 1J:
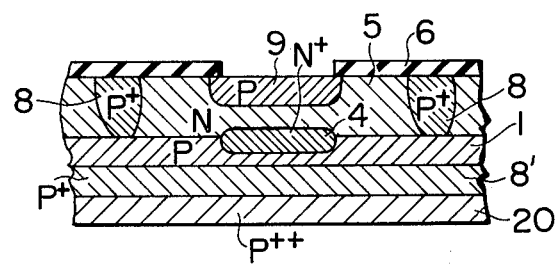
Figure 1K:
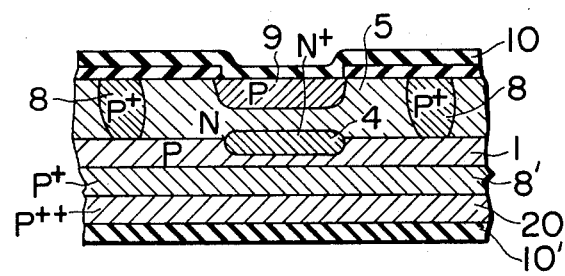
Figure 1L:
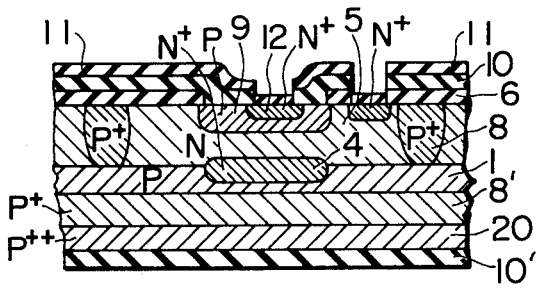
Figure 1M:
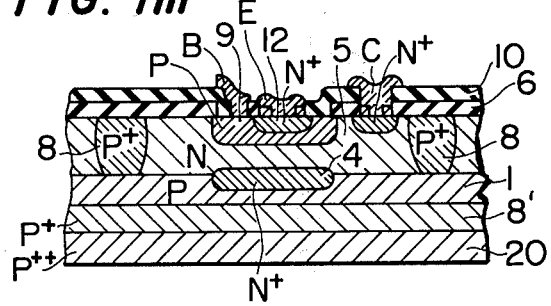
Figure 1N:
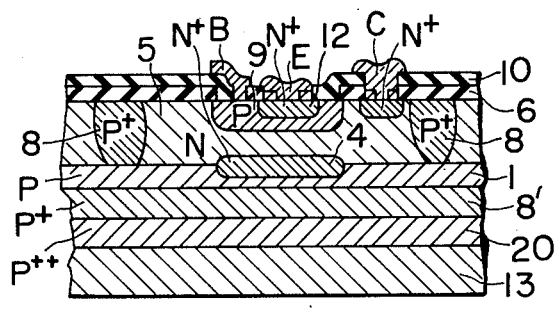

FIGS. 1a – 1n show an embodiment of the present invention, which illustrates a method of making ICs in which the formation of an N-type inversed layer is prohibited between the silicon substrate and the support, thereby preventing the formation of a PNPN thyristor which is caused by the N-type inverted layer. In FIGS. 1a – 1n the reference numeral 1 represents a P-type silicon substrate, 2 and 2 silicon dioxide ($SiO_2$) films, 3 a photoresist film, 4 an $N^+$-type buried layer, 5 an N-type epitaxial layer, 6 and 6' $SiO_2$ films, 7 a photoresist film, 8 and 8' $P^+$-type isolation regions, 9 a P-type region, 10 and 10' $SiO_2$ films, 11 a photoresist film, 12 an $N^+$-type region, B a base electrode, E an emitter electrode, C a collector electrode, and 13 a support.

As shown in FIG. 1a, the method of making an IC according to an embodiment of the present invention, consists of forming an $SiO_2$ film 2 and an $SiO_2$ film 2' on the front and back surfaces of the P-type silicon substrate 1, respectively, selectively removing by etching part of the $SiO_2$ film 2 utilizing, as a mask, a photoresist film 3 on the front surface of the $SiO_2$ film 2, and diffusing N-type impurities through such a removed portion by means of a conventional diffusion technique to form an $N^+$-type buried layer 4 (FIGS. 1b, 1c, and 1d). Then, as shown in FIG. 1e the aforementioned $SiO_2$ film 2 is completely removed to form an N-type epitaxial layer 5 on the front surface of the silicon substrate 1 by means of a conventional epitaxial technique (FIG. 1f). Subsequent to such operations, an $SiO_2$ film 6 is newly formed on the N-type epitaxial layer 5, a photoresist film 7 is coated on the $SiO_2$ film 6 for the purpose of forming a first $P^+$-type isolation region 8 thereon (FIG. 1g), and the back surface is removed by etching to expose the silicon substrate 1 (FIG. 1). Then P-type impurities are diffused through the removed portion of the $SiO_2$ film 6 to form a second $P^+$-type isolation region 8'(FIG. 1i). A P-type base region 9 is subsequently formed in the N-type epitaxial layer 5 (FIG. 1j), whereby a $P^{++}$ layer 20 is formed on the back surface of the substrate 1.

Thereafter, as shown in the FIG. 1k, an $SiO_2$ film 10 is formed on the $SiO_2$ film 6 and an $SiO_2$ film 10' is formed on the back face of the silicon substrate 1 by means of a chemical vapor deposition technique, a photoresist film 11 is formed thereon (FIG. 11); using the photoresist film 11 as a mask, an $N^+$-type region 12 is formed. Here, the $SiO_2$ film 10' at the back face serves to prevent the formation of an $N^+$-type diffusion layer on the back face of said silicon substrate at the time of forming the $N^+$-type region.

Next, as shown in FIG. (1m), openings for passing electrodes such as base, emitter and collector are formed on the $SiO_2$ film 10, and then the electrodes are formed by way of aluminum evaporation coating (FIG. 1m).

The $SiO_2$ film 10' is also completely removed from the back face of the substrate 1 during the formation of openings for electrodes in this step. Then after the scribing step, each pellet is applied to an electrically conductive support 13 such as Kovar via a eutectic layer of Au-Si (FIG. 1n).

According to such a method of making ICs of the present invention, the impurity concentration in the silicon substrate 1 contacting to the Au-Si eutectic layer becomes as high as $P^{++}$; therefore, no N-type inverted layer is formed between the contacting portion, i.e. between the interface of the silicon substrate 1 and the support 13, thereby establishing a complete ohmic contact. Therefore, it is possible to efficiently prevent the thyristor phenomenon caused by the N-type inverted layer, and to easily manufacture the integrated circuits as compared with earlier manufacturing methods. It should, further, be understood that the method of making IC free from the formation of a parasitic PNPN thyristor of the present invention, is not limited to the aforementioned embodiment only, but can be applied to the methods of making a variety of semiconductor devices.

What is claimed is:

1. In an integrated circuit having at least one or more NPN transistors using a semiconductor substrate of one conductivity type, a method of making integrated circuits free from the formation of a parasitic PNPN thyristor characterized in that a layer of the second conductivity type is formed on said substrate, an isolation region of the first conductivity type is formed in said layer, a layer of the first conductivity type having a high impurity concentration is formed on the back face of said substrate, a diffusion layer of the first conductivity type which serves as a base region of said NPN transistor is formed in said layer of the second conductivity type, a layer of the first conductivity type having a high impurity concentration is formed on the back face of said substrate, an insulation layer is formed on the back face of said substrate and on the substrate, snd a diffusion layer of the second conductivity type which serves as an emitter region of said NPN transistor is formed with said insulation layer as a mask.

* * * * *